(12) United States Patent
Kondo et al.

(10) Patent No.: US 8,120,450 B2
(45) Date of Patent: Feb. 21, 2012

(54) HIGH FREQUENCY CIRCUIT MODULE

(75) Inventors: Hayato Kondo, Yao (JP); Kenji Maeda, Chiyoda-ku (JP)

(73) Assignee: Hosiden Corporation, Yao-Shi (JP)

( * ) Notice: Subject to any disclaimer, the term of this patent is extended or adjusted under 35 U.S.C. 154(b) by 295 days.

(21) Appl. No.: 12/535,176

(22) Filed: Aug. 4, 2009

(65) Prior Publication Data

US 2010/0124390 A1 May 20, 2010

(30) Foreign Application Priority Data

Nov. 14, 2008 (JP) .................................. 2008-291717

(51) Int. Cl.
*H01P 1/00* (2006.01)
*G02B 6/12* (2006.01)

(52) U.S. Cl. ........ 333/248; 333/246; 333/247; 333/245; 385/14

(58) Field of Classification Search ............. 385/14, 385/24, 88, 89, 129, 130, 131, 132; 333/116, 333/128, 122, 135, 157, 161, 204, 220, 245, 333/246, 247, 248

See application file for complete search history.

(56) References Cited

U.S. PATENT DOCUMENTS

| 5,313,536 | A | * | 5/1994 | Rossi et al. | 385/14 |
| 5,768,109 | A | * | 6/1998 | Gulick et al. | 361/794 |
| 6,847,274 | B2 | * | 1/2005 | Salmela et al. | 333/222 |
| 7,088,881 | B2 | * | 8/2006 | Nir | 385/16 |
| 7,224,857 | B2 | * | 5/2007 | Liu | 385/14 |
| 2006/0133718 | A1 | * | 6/2006 | Liu | 385/14 |
| 2010/0124390 | A1 | * | 5/2010 | Kondo et al. | 385/14 |

FOREIGN PATENT DOCUMENTS

| JP | 60-226196 A | 11/1985 |
| JP | 64-067947 A | 3/1989 |
| JP | 1-86265 U1 | 6/1989 |
| JP | 4-10984 U1 | 1/1992 |
| JP | 2007-165945 A1 | 6/2007 |

OTHER PUBLICATIONS

Office Action dated Mar. 15, 2011 entitled "Notification of Reasons for Refusal" for the counterpart Japanese application No. 2008-291717 with English translation.

* cited by examiner

*Primary Examiner* — Brian Healy
(74) *Attorney, Agent, or Firm* — Kratz, Quintos & Hanson, LLP

(57) ABSTRACT

The invention provides a high frequency circuit module according to the present invention includes: a circuit component having a plurality of terminals arranged on an outer side thereof, and a circuit board of a multilayered construction or a single-layered construction. A first outer face of the circuit board serves as a component mounting face for mounting the circuit component. The circuit board includes a ground conductor layer; a plurality of electrode pads provided on the component mounting face, the electrode pads being configured for connection with the associated terminals of the circuit component; and a plurality of waveguides provided on the first outer face or a second outer face, or in an inner portion of the circuit board. The waveguides are electrically connected with the associated electrode pads. Routing directions of all or some of adjacent waveguides are opposite from each other.

5 Claims, 4 Drawing Sheets

HIGH FREQUENCY CIRCUIT MODULE

The present application claims priority under 35 U.S.C. §119 of Japanese Patent Application No. 2008-291717 filed on Nov. 14, 2008, the disclosure of which is expressly incorporated by reference herein in its entity.

TECHNICAL FIELD

The present invention relates to high frequency circuit modules that have excellent high frequency characteristics.

BACKGROUND ART

An example of high frequency circuit module is an evaluation board for measurement of high frequency characteristics of signaling channels inclusive of cables and connectors. A known evaluation board as disclosed in Patent Literature 1 is mounted with a connector for connection with a cable and a coaxial connector for connection with a measuring instrument. The evaluation board has a wiring pattern and the like to establish electrical connection between the connectors.

Patent Literature 1: Japanese Unexamined Patent Publication No. 2007-165945

Among others, in evaluation boards supporting high-speed differential signaling such as ones compliant with Display-Port (a standard for digital interfaces), the working frequencies are as high as several GHz or higher. Such evaluation boards are required to use a connector for cable connection and a wiring pattern that are designed with full consideration to impedance matching, minimization of skew (temporal delay between transmission lines), and reduction of crosstalk.

SUMMARY OF INVENTION

Technical Problem

A known problem with a connector for cable connection (a multi-pin connector) arises in a case where the connector has board-mounting terminals that are arranged at small pitches. The terminals are connected to a wiring pattern (traces) at small spacings, prone to the occurrence of undesirable crosstalk.

One possible solution of this problem is to route adjacent traces in opposite directions, approximately doubling in trace pitches. However, the traces with routing directions inverted by 180 degrees pass below the multi-pin connector and are thus subject to direct influence of the capacitance possessed by the multi-pin connector itself. In other words, opposite direction routing means a mixed configuration of some traces under significant influence of the capacitance of the multi-pin connector itself and other traces under lesser influence of the capacitance. Such mixed configuration should invite another problem, i.e., deterioration in high frequency characteristics (S-parameters).

The above problems concern not only evaluation boards but also high frequency circuit modules in general having circuit boards and circuit components mounted thereon.

The present invention was conceived in light of the foregoing situation. The invention provides a high frequency circuit module capable of reducing crosstalk, with reduced adverse effect from a capacitance possessed by a circuit component itself.

Solution to Problem

A high frequency circuit module according to the present invention includes: a circuit component having a plurality of terminals arranged on an outer side thereof, and a circuit board of a multilayered construction or a single-layered construction. A first outer face of the circuit board serves as a component mounting face for mounting the circuit component. The circuit board includes a ground conductor layer; a plurality of electrode pads provided on the component mounting face, the electrode pads being configured for connection with the associated terminals of the circuit component; and a plurality of waveguides provided on the first outer face or a second outer face, or in an inner portion of the circuit board. The waveguides are electrically connected with the associated electrode pads. Routing directions of all or some of adjacent waveguides are opposite from each other.

In this aspect of the invention, the routing directions of all or some of adjacent waveguides are opposite from each other, so that wider pitches can be allocated between the waveguides, resulting in reduced crosstalk. Moreover, the circuit board is provided with the ground conductor layer, which is in approximately equal proximity to the waveguides that pass below the circuit component and to the other waveguides that do not pass below the circuit component. This structure can negate almost all the influence of the capacitance possessed by the circuit component itself against the waveguides that pass below the circuit component. Thus, the circuit module is advantageously improved in high frequency characteristics of the entire circuit.

The waveguides may be microstrip lines. The ground conductor layer may serve as a counter-electrode of the microstrip lines.

In this case, the ground conductor layer also functions as a counter-electrode of the waveguides, i.e., microstrip lines. This configuration can simplify the structure of the circuit module.

In a case where the waveguides is provided on the second outer face of the circuit board or in the inner portion of the circuit board, the circuit board may further include through-hole electrodes for establishing electrical connection between the electrode pads and the waveguides. The through-hole electrodes may be located below the circuit component or in a vicinity of the circuit component.

In this case, the transmission paths have a discontinuous configuration by the presence of the through-hole electrodes located between the electrode pads and the waveguides. However, the through-hole electrodes are located in the vicinity of the circuit component that generally has inferior electrical properties, so that the through-hole electrodes are affected by the capacitance of the circuit component. Such positional relationship can alleviate the problem of deterioration in high frequency characteristics due to the discontinuous configuration. Thus, this aspect of invention can provide improvement in the high frequency characteristics of the entire circuit of the circuit module.

In a case where the high frequency circuit module comprising an evaluation circuit board for use in measurement of a high frequency characteristic of a signaling channel inclusive of the circuit component, the high frequency circuit module may further include a plurality of high frequency connectors mounted on the circuit board. The circuit component may be a multi-pin connector. The multi-pin connector and the high frequency connectors may be electrically connected via the waveguides.

Also in this case, the routing directions of all or some of adjacent waveguides are opposite from each other, so that wider pitches can be allocated between the waveguides, resulting in reduced crosstalk. Moreover, the circuit board is provided with the ground conductor layer, which is in approximately equal proximity to the waveguides that pass below the circuit component and to the other waveguides that do not pass below the circuit component. This structure can negate almost all the influence of the capacitance possessed by the circuit component itself against the waveguides that pass below the circuit component. Consequently, the evaluation circuit board is advantageously improved in high frequency characteristics.

The second face of the circuit board opposite from the component mounting face may serve as a wiring face for the waveguides.

In this case, since the waveguides are disposed on a different face from the component mounting face of the circuit board, a single calibration kit can perform subtraction of the characteristics of the waveguides through arithmetic operation. Further, calibration work should also become easier because the above configuration can prevent an inadvertent touch with a hand on the face disposed with the waveguides.

DESCRIPTION OF EMBODIMENTS

Figure 1:
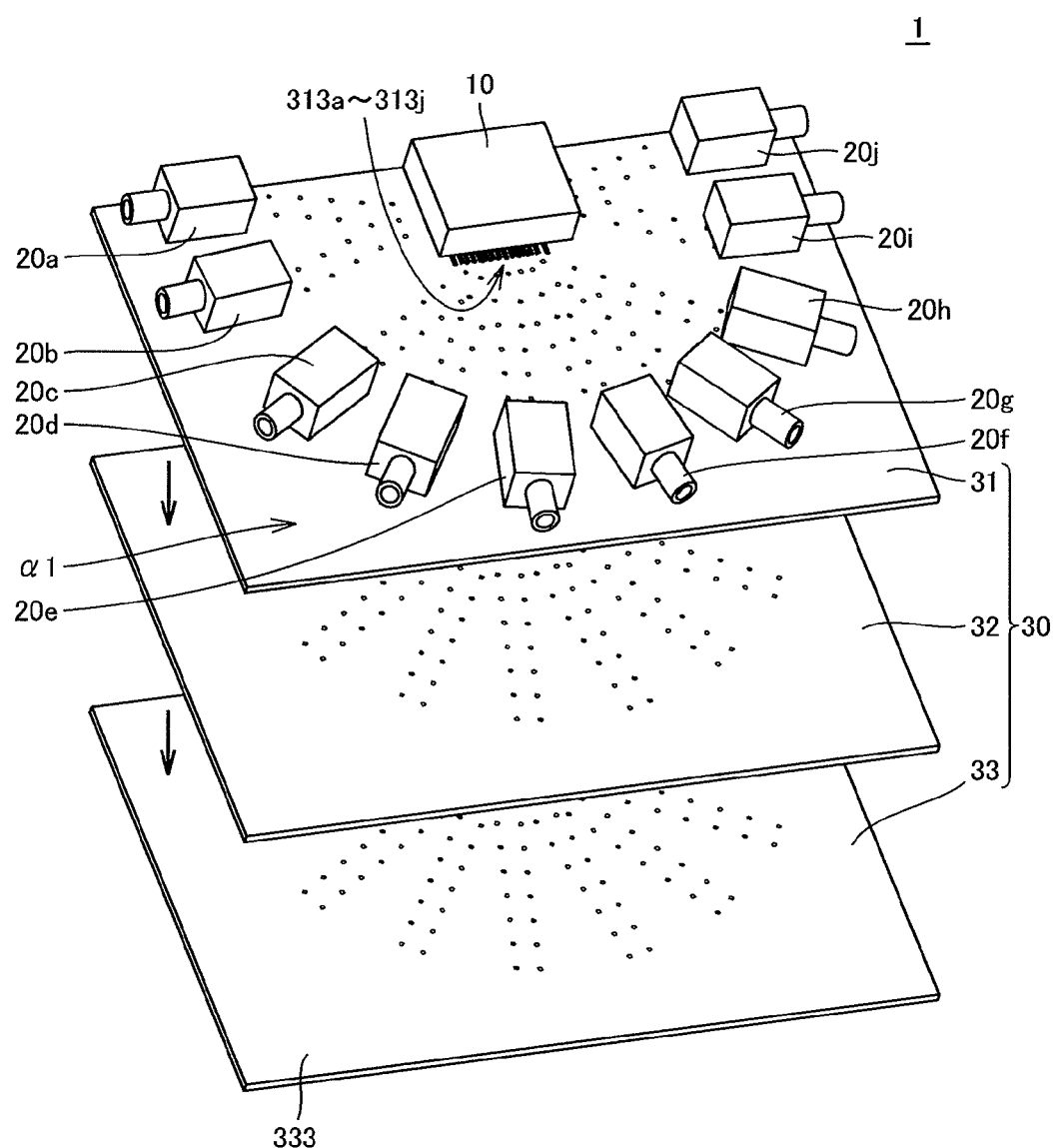
FIG. 1 is an exploded perspective view of an evaluation board according to an embodiment of the present invention.

An embodiment of the present invention is described below with reference to FIGS. 1 to 4. The components illustrated in the figures and the constituent elements of the present invention recited in the claims are listed alongside in the Reference Signs List below to clarify the correspondence therebetween.

A high frequency circuit module exemplified herein is an evaluation board 1 capable of high speed differential signaling and compliant with the DisplayPort standard. The high frequency circuit module as shown in FIG. 1 includes a multi-pin connector 10 for connection with a cable, ten coaxial connectors 20a to 20j for connection with measuring instruments, and a circuit board 30 mounted with these two kinds of connectors.

The multi-pin connector 10 is a rectangular 10-pin receptacle connector of a board mounting type. It is adapted to receive a plug connector attached to an end of a flat cable (not shown). The multi-pin connector 10 includes a case 11 of plastic material (see FIG. 4) into which connecting terminals or the like are press fitted (not shown), and a metal shield case (not shown) that covers the upper face, the right and left lateral faces, and the rear face of the case 11. The outer bottom face of the case 11 is provided with ten terminals 12 for signal input/output (see FIG. 4) arranged at equal pitches.

Figure 2:
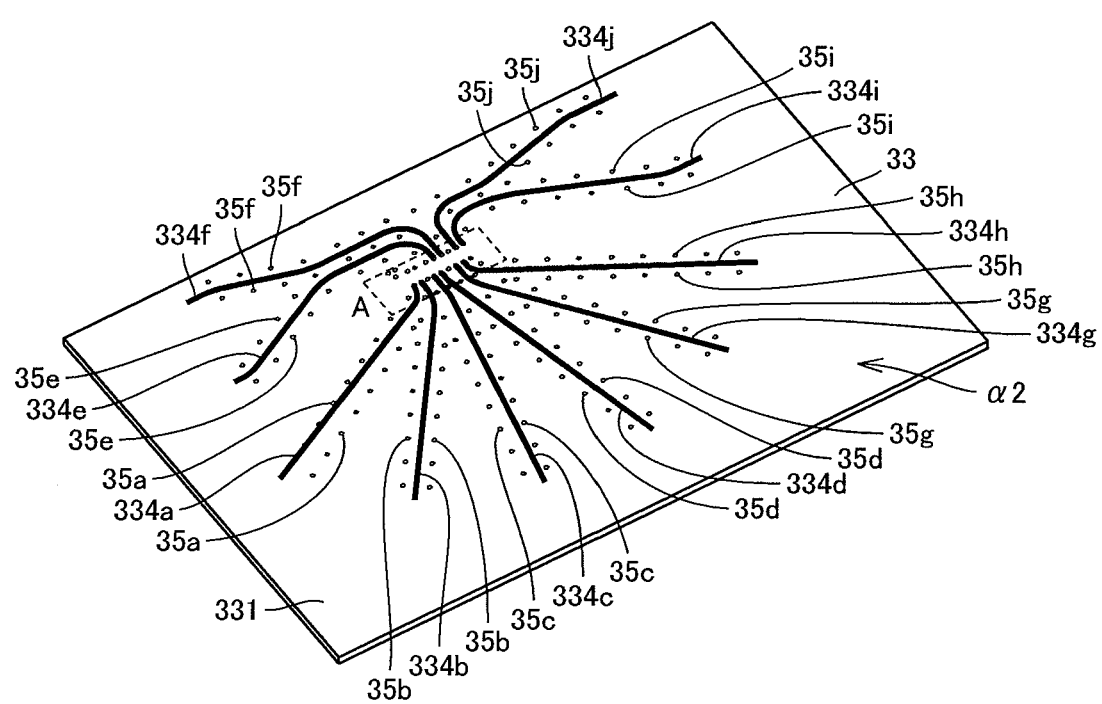
FIG. 2 is a schematic perspective view of a back face of the evaluation board.
Figure 4:
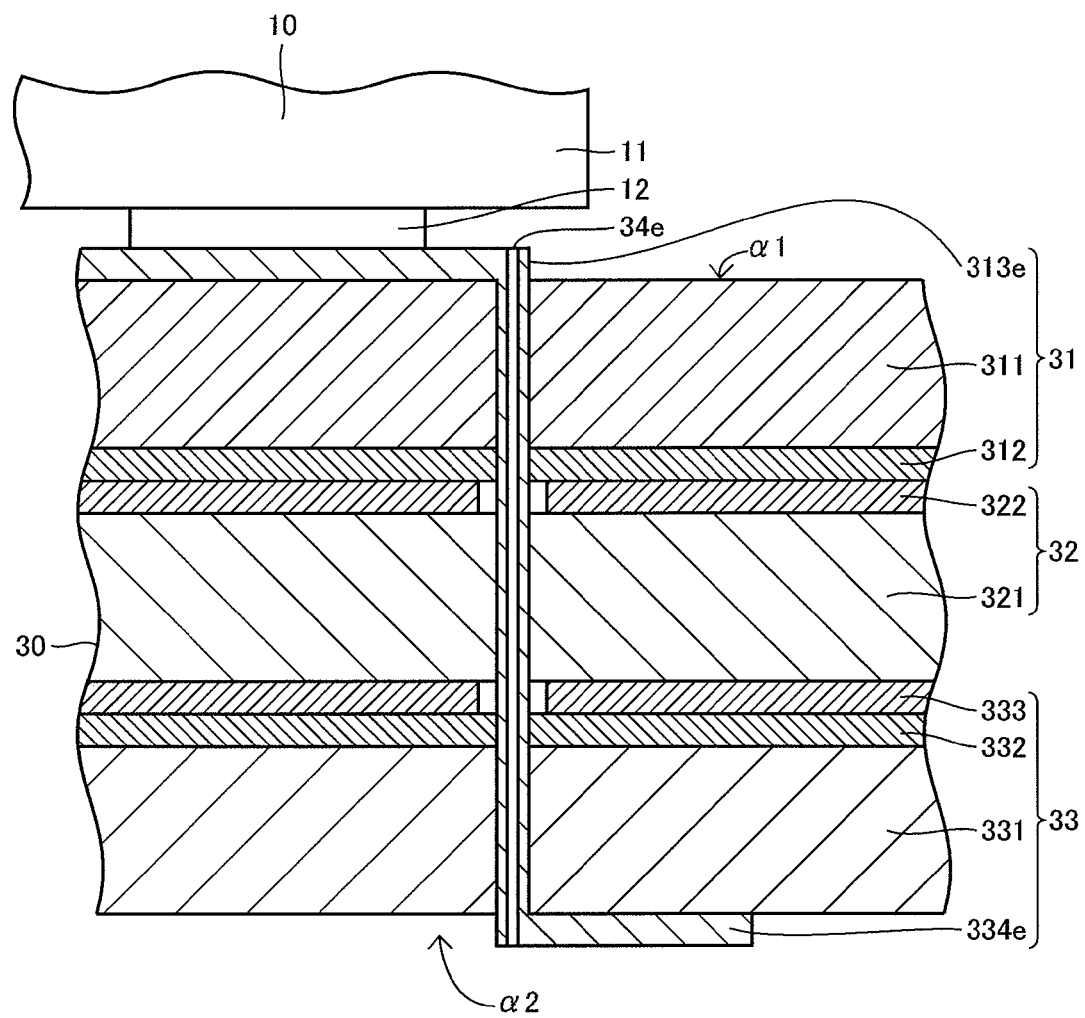
FIG. 4 is a cross-sectional view taken along line 4-4 of FIG. 3.

Although not shown in FIGS. 1, 2, or 4, attachment pieces are provided at edges of the shield case for attaching the multi-pin connector 10 onto the circuit board 30; and holes for receiving the attachment pieces are formed in the circuit board 30.

The coaxial connectors 20a to 20j are receptacle-type coaxial connectors of a board mounting type. They are adapted to receive plug-receptacle-type coaxial connectors that are attached at ends of coaxial cables (not shown). Matching the number of pins of the multi-pin connector 10, there are provided ten coaxial connectors 20a to 20j on the circuit board 30.

In the present embodiment, the circuit board 30 is a three-layer board, in which a first sheet layer 31, a second sheet layer 32, and a third sheet layer 33 are laminated in the descending order, as shown in FIG. 4. The figure also illustrates dielectric layers 311, 321, and 331 of glass, ceramic, resin, or other material and insulative layers 312 and 332 of pre-preg or other material.

The multi-pin connector 10 is mounted on the top face of the circuit board 30, centrally along a long side thereof. The coaxial connectors 20a to 20j are arranged and mounted in a semi-spherical fashion about the multi-pin connector 10.

In the present embodiment, the top face (first outer face) of the circuit board 30 serves as a component mounting face α1, while the back face (second outer face) of the circuit board 30 serves as a wiring face α2 (see FIG. 2). As shown in FIG. 4, a power source pattern 322 and a ground pattern 333 are formed inside the circuit board 30. More specifically, the power source pattern 322 is provided between the dielectric layer 321 and the insulative layer 312, and the ground pattern 333 is provided between the dielectric layer 321 and the insulative layer 332.

Figure 3:
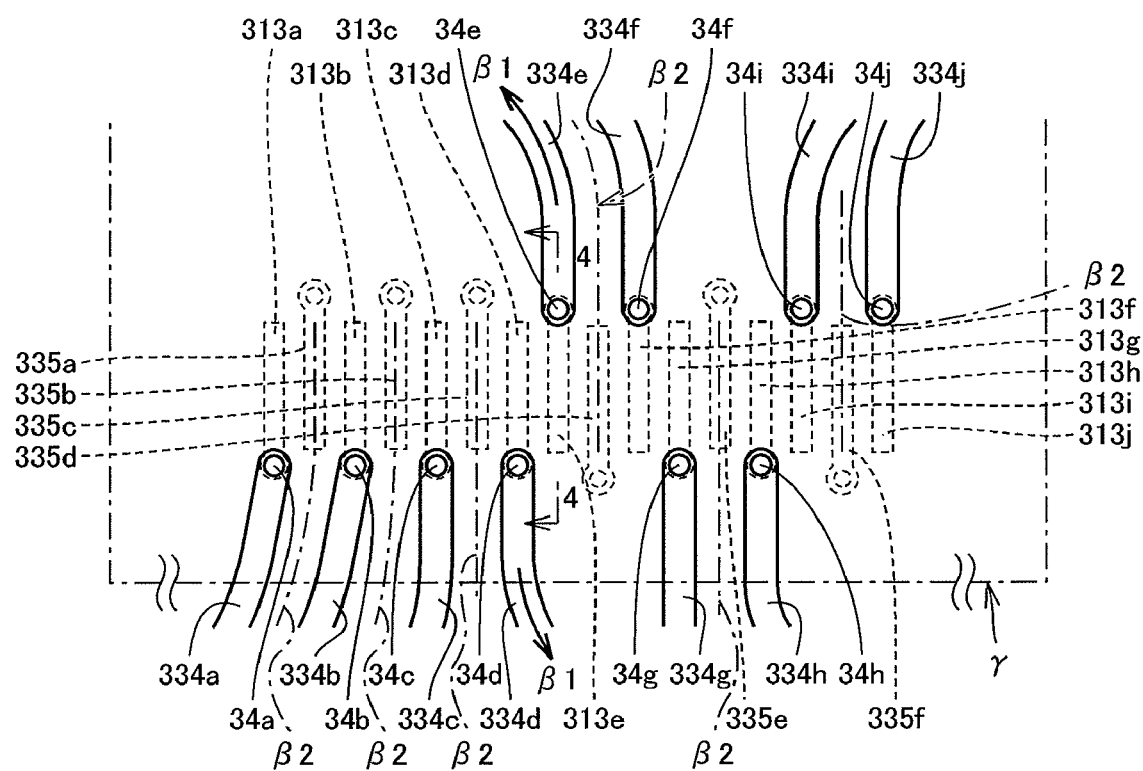
FIG. 3 is an enlarged view of a portion A indicated in FIG. 2.

The component mounting face α1 of the circuit board 30 is provided with electrode pads 313a to 313j (see FIGS. 3 and 4). The electrode pads 313a to 313j are connected with the associated terminals 12 of the multi-pin connector 10. The wiring face α2 of the circuit board 30 is provided with microstrip lines 334a to 334j that are electrically connected with the associated electrode pads 313a to 313j. Through-hole electrodes 34a to 34j (see FIG. 3) are provided inside the circuit board 30 to establish electrical connection between the electrode pads 313a to 313j and the microstrip lines 334a to 334j.

As shown in FIG. 3, the electrode pads 313a to 313j are a total of ten rectangular lands, equal in number and pitch distance to the terminals 12 of the multi-pin connector 10.

The through-hole electrodes 34a to 34j extend vertically through the circuit board 30, near the outer ends of the electrode pad 313a to 313j. There are a total of ten through-hole electrodes, matching in number with the electrode pads 313a to 313j.

In FIG. 3, an area γ defined by dashed-dotted lines is a component area of the multi-pin connector 10. It should be noted that the through-hole electrodes 34a to 34j, the electrode pads 313a to 313j, etc. are located within the area γ, i.e., below the multi-pin connector 10.

The microstrip lines 334a to 334j are plate conductors that extend from the lower ends of the through hole electrodes 34a to 34j connected with the ends of the electrode pads 313a to 313j (see FIG. 4) to lower ends of through-hole electrodes (not shown) connected to the coaxial connectors 20a to 20j. A total of ten microstrip lines 334a to 334j are provided, matching in number with the electrode pads 313a to 313j and with the coaxial connectors 20a to 20j. The ground pattern 333 functions as a counter-electrode of each of the microstrip lines 334a to 334j. The microstrip lines 334a to 334j have the same length.

As shown in FIGS. 2 and 3, not all the routing directions β1 of the microstrip lines 334a to 334j are the same. Of all the microstrip lines 334a to 334j, the adjacent microstrip lines 334d and 334e are routed in opposite directions β1. The same holds true for the microstrip lines 334f and 334g as well as the microstrip lines 334h and 334i. This configuration is adopted for the purpose of enlarging the pitches between adjacent microstrip lines (334d and 334e, and other pairs) and for the reason of pattern layouting the multi-pin connector 10 and other components.

As a result, the adjacent strip lines 334a and 334b of the microstrip lines 334a to 334j have the same routing directions β1. The same holds true for the strip lines 334b and 334c, strip lines 334c and 334d, strip lines 334e and 334f, strip lines 334g and 334h, and strip lines 334i and 334j.

For improvement of the high frequency characteristics of the entire circuit of the circuit module, supplementary conductor patterns 335a to 335f are provided between certain electrode pads 313a to 313j on the component mounting face α1 of the circuit board 30 (see FIG. 3). For the same purpose, ground conductor via holes 35a to 35j are formed in the vicinity of each of the microstrip lines 334a to 334j (see FIG. 2).

As shown in FIG. 3, the supplementary conductor patterns 335a to 335f are plate conductors that are each provided on a centerline β2 of each two adjacent microstrip lines 334a to 334j extending in the same routing directions β1. The supplementary conductor patterns 335a to 335f are thus located between the electrode pads 313a to 313j associated with the microstrip lines 334a to 334j extending in the same routing directions β1. The supplementary conductor patterns 335a to 335f are electrically connected with the ground pattern 333 via through-hole electrodes (not shown). A total of six supplementary conductor patterns 335a to 335f are provided, matching in number with the adjacent microstrip lines 334a to 334j of the same routing directions β1.

As shown in FIG. 2, the ground conductor via holes 35a to 35j are provided at predetermined intervals, along the length and on both sides of each microstrip lines 334a to 334j on the circuit board 30. Although not shown, the via holes 35a to 35j are electrically connected to the ground pattern 333. The plurality of ground conductor via holes 35a are associated with the microstrip line 334a, the holes 35b with the microstrip line 334b, . . . and the holes 35j are associated with the microstrip line 334j.

The evaluation board 1 as configured above is advantageously excellent in high frequency characteristics. Even with the working frequency of several GHz or higher, the evaluation board 1 is well adapted for impedance matching and reduction of crosstalk in the signaling channels extending from the multi-pin connector 10 to the coaxial connectors 20a to 20j.

The high frequency circuit module of the invention is applicable to test fixtures compliant with HDMI® (High-Definition Multimedia Interface), DisplayPort, or other standards. The invention is also applicable to other kinds of high frequency circuit boards mounted with integrated circuits and other components.

Particularly the circuit board related to the present invention is similarly applicable to single-layer boards, double-sided boards, and flexible boards. In the case of a single-layer board, the board may have embedded microstrip lines, i.e., waveguides buried in a dielectric layer of the board. The ground conductor layer may be formed on the top or back face of the circuit board. In the case of employing a multilayer board, the waveguides may be provided in an internal portion of the board. The waveguides may be provided on the component mounting face, in which case the waveguides may be connected directly with the electrode pads. The electrode pads may be provided with through holes to receive the terminals of the circuit component. The waveguides may be other kinds of transmission lines such as strip lines or Lecher wires, and the routing directions of all adjacent waveguides may be opposite each other.

REFERENCE SIGNS LIST

1 Evaluation board (high frequency circuit module)
  10 Multi-pin connector (circuit component)
    11 Case
    12 Terminal
  20a to 20j Coaxial connector (high frequency connector)
  30 Circuit board
    31 First sheet layer
      311 Dielectric layer
      312 Insulative layer
      313a to 313j Electrode pad
    32 Second sheet layer
      321 Dielectric layer
      322 Power source pattern
    33 Third sheet layer
      331 Dielectric layer
      332 Insulative layer
      333 Ground pattern (ground conductor layer)
      334a to 334j Microstrip line (waveguide)
    34 Through-hole electrode
    α1 Component mounting face
    α2 Wiring face
    β1 Routing direction
    β2 Centerline
    γ Component area

The invention claimed is:

1. A high frequency circuit module, comprising:
a circuit component, having a plurality of terminals arranged on an outer side thereof; and
a circuit board of a multilayered construction or a single-layered construction,
the circuit board including:
  a first outer face serving as a component mounting face for mounting the circuit component;
  a second outerface;
  a ground conductor layer;
  a plurality of electrode pads provided on the component mounting face, the electrode pads being configured for connection with the associated terminals of the circuit component;
  a plurality of waveguides provided on the second outer face, the waveguides being electrically connected with the associated electrode pads, and
  through-hole electrodes for establishing electrical connection between the electrode pads and the waveguides, the through-hole electrodes being located below the circuit component or in a vicinity of the circuit component,
  wherein routing directions of all or some of adjacent waveguides are opposite from each other.

2. The high frequency circuit module according to claim 1, wherein the waveguides are microstrip lines, and the ground conductor layer serves as a counter-electrode of the microstrip lines.

3. The high frequency circuit module according to claim 1, the high frequency circuit module comprising an evaluation circuit board for use in measurement of a high frequency characteristic of a signaling channel inclusive of the circuit component, the high frequency circuit module further comprising:
a plurality of high frequency connectors mounted on the circuit board, wherein
the circuit component comprises a multi-pin connector, and the multi-pin connector and
the high frequency connectors are electrically connected via the waveguides.

4. The high frequency circuit module according to claim 2, the high frequency circuit module comprising an evaluation circuit board for use in measurement of a high frequency characteristic of a signaling channel inclusive of the circuit component, the high frequency circuit module further comprising:

a plurality of high frequency connectors mounted on the circuit board, wherein the circuit component comprises a multi-pin connector, and the multi-pin connector and the high frequency connectors are electrically connected via the waveguides.

5. The high frequency circuit module according to claim 1, wherein the second face of the circuit board opposite from the component mounting face serves as a wiring face for the waveguides.

* * * * *